(12) United States Patent
Choi et al.

(10) Patent No.: US 8,785,914 B2
(45) Date of Patent: Jul. 22, 2014

(54) PIEZOELECTRIC NANOWIRE STRUCTURE AND ELECTRONIC DEVICE INCLUDING THE SAME

(75) Inventors: Duk-Hyun Choi, Hwaseong-si (KR); Jae-Young Choi, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 355 days.

(21) Appl. No.: 12/872,304

(22) Filed: Aug. 31, 2010

(65) Prior Publication Data
US 2011/0101315 A1 May 5, 2011

(30) Foreign Application Priority Data

Oct. 30, 2009 (KR) .................. 10-2009-0104648

(51) Int. Cl.
*H01L 51/00* (2006.01)
*H01L 21/02* (2006.01)

(52) U.S. Cl.
USPC .. 257/40; 438/50; 257/E21.002; 257/E51.001

(58) Field of Classification Search
None
See application file for complete search history.

(56) References Cited

U.S. PATENT DOCUMENTS

2008/0067618 A1* 3/2008 Wang et al. .................. 257/415
2008/0129278 A1   6/2008 Dae et al.

FOREIGN PATENT DOCUMENTS

JP  2008-047693 A    2/2008
KR  10-2007-0031700 A  3/2007

OTHER PUBLICATIONS

Lu et al. "Piezoelectric Nanogenerator Using p-Type ZnO Nanowire Arrays" Nano Letters 2009, 9, 1223-1227. Date of publication: Feb. 11, 2009.*
Xi et al. "Growth of ZnO nanotube arrays and nanotube based piezoelectric nanogenerators" Journal of Materials Chemistry 2009, 19, 9260-9264. Date of publication: Aug. 29, 2009.*
Hillman et al. "Time-Temperature Superposition for Viscoelastic Properties of Regioregular Poly(3-hexylthiophene) Films" J. Am. Chem. Soc. 2005, 127, 3817-3824. Date of online publication: Mar. 1, 2005.*

* cited by examiner

*Primary Examiner* — Andrew K Bohaty
(74) *Attorney, Agent, or Firm* — Cantor Colburn LLP

(57) ABSTRACT

A piezoelectric nanowire structure includes a base substrate, a plurality of piezoelectric nanowires disposed on the base substrate, and a piezoelectric organic material layer disposed on the base substrate and covering the plurality of piezoelectric nanowires.

11 Claims, 6 Drawing Sheets

PIEZOELECTRIC NANOWIRE STRUCTURE AND ELECTRONIC DEVICE INCLUDING THE SAME

CROSS-REFERENCE TO RELATED APPLICATIONS

This application claims priority to Korean Patent Application No. 10-2009-0104648 filed on Oct. 30, 2009, and all the benefits accruing therefrom under 35 U.S.C. §119, the entire content of which is incorporated herein by reference.

BACKGROUND

1. Field

Provided is a piezoelectric nanowire structure and an electronic device including the same.

2. Description of the Related Art

In order to realize down-sizing and high performance of electronic devices, nanoscale devices are being advanced. This requires developing techniques for forming nanowires in order to provide the nanoscale devices. A nanowire is an ultrafine line having a cross-sectional diameter of about several nanometers (nm) to about several hundred nanometers (nm). In addition, the length of the nanowire may be grown to about several tens or several thousand times or more of the diameter.

The nanowire may have different electrical, chemical, physical, and optical characteristics from general characteristics shown in the conventional bulk structure. By using the molecular characteristics of nanowires together with the characteristics of a bulk structure, it is possible to accomplish finer and more integrated devices. Nanowires may be applied to various fields, such as for lasers, transistors, memories, sensors, and the like.

However, the piezoelectric nanowires are easily damaged by external force due to the ultrafine lines having a cross-sectional area of a very small diameter.

In addition, there has been a tendency to produce mobile electronic devices that are down-sized, portable, and integrated with various functions. In order to supply electric power to the mobile electronic devices, a battery having appropriate capacity is required. However, the capacity of a battery supplying electric power is behind the trend of integrating these devices with various functions. Accordingly, a subsidiary battery is required. That is, a subsidiary battery urgently needs to be developed as a power source that is capable of being wirelessly charged.

SUMMARY

A piezoelectric nanowire structure that is not easily damaged by external force, and an electronic device using the same are provided.

Provided is a piezoelectric nanowire structure including a base substrate, a plurality of piezoelectric nanowires disposed on the base substrate, and a piezoelectric organic material layer disposed on the base substrate and covering the plurality of piezoelectric nanowires.

Provided is an electronic device including a first electrode and a second electrode spaced apart from each other, a plurality of piezoelectric nanowires disposed on the first electrode, and a piezoelectric organic material layer disposed between the first electrode and the second electrode and covering the plurality of piezoelectric nanowires.

BRIEF DESCRIPTION OF THE DRAWINGS

The above and other advantages and features of this disclosure will become more apparent by describing in further detail embodiments thereof with reference to the accompanying drawings, in which.

DETAILED DESCRIPTION

Figure 1A:
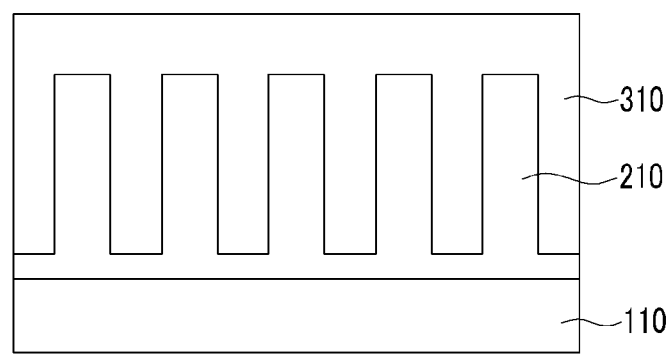
FIG. 1A is a cross-sectional view showing an embodiment of a piezoelectric nanowire structure, according to the invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on" or "connected to" another element or layer, the element or layer can be directly on or connected to another element or layer or intervening elements or layers. In contrast, when an element is referred to as being "directly on" or "directly connected to" another element or layer, there are no intervening elements or layers present. Like numbers refer to like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "lower," "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "lower" relative to other elements or features would then be oriented "upper" relative to the other elements or features. Thus, the exemplary term "lower" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Hereinafter, embodiments are described referring to drawings.

Figure 1B:
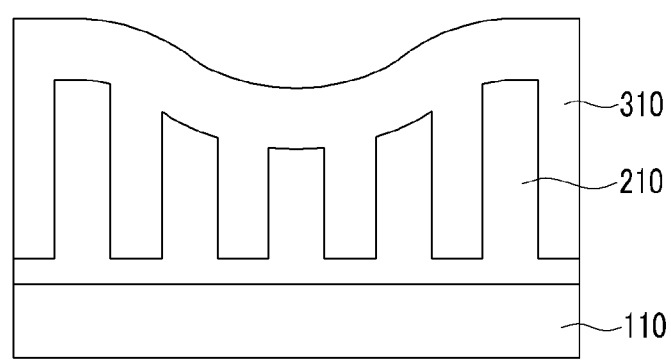
FIG. 1B is a cross-sectional view showing an embodiment of operation of the piezoelectric nanowire structure of FIG. 1A.

The piezoelectric nanowire structure according to an embodiment of the invention is described with reference to FIG. 1A and FIG. 1B. FIG. 1A is a cross-sectional view showing an embodiment of the piezoelectric nanowire structure, according to the invention, and FIG. 1B is a cross-sectional view showing an embodiment of the operation of the piezoelectric nanowire structure in FIG. 1A.

As shown in FIG. 1A, the piezoelectric nanowire structure includes a base substrate 110, a plurality of a piezoelectric nanowire 210 disposed directly on the base substrate 110, and a piezoelectric organic material layer 310 covering the plurality of piezoelectric nanowires 210. In an embodiment, the plurality of a piezoelectric nanowire 210 may be grown directly on the base substrate 110. The piezoelectric nanowires 210 includes a base portion and a plurality of a protruding portion extending directly from the base portion, such that the piezoelectric nanowires 210 collectively form a single unitary indivisible element.

In FIG. 1A, the piezoelectric organic material layer 310 contacts an entire of upper and side surfaces of the plurality of a piezoelectric nanowire 210. The piezoelectric organic material layer 310 is disposed in an entire area between adjacent protruding portions of the piezoelectric nanowires 210. On the upper surfaces of the piezoelectric nanowires 210, the piezoelectric organic material layer 310 may extend across areas between the adjacent protruding portions of the piezoelectric nanowires 210, such that the piezoelectric organic material layer 310 is effectively planarized on the upper surfaces of the piezoelectric nanowires 210.

The base substrate 110 may be an inorganic material such as glass or silicon (Si), or a polymer material such as polyethylene terephthalate ("PET"), polyethylene sulfone ("PES"), and the like. In addition, the base substrate 110 may be coated with a conductive material such as a metal, a metal oxide, carbon nanotubes ("CNT"), graphene, and the like on the insulator material. The base substrate 110 may be transparent and flexible.

The piezoelectric nanowires 210 may include an inorganic material. The inorganic material of the piezoelectric nanowires 210 may include zinc oxide (ZnO), lead zirconate titanate ("PZT"), barium titanate ($BaTiO_3$), lead titanate ($PbTiO_3$), aluminum nitride ("AlN"), gallium nitride ("GaN"), or silicon carbide ("SiC"), or one of other piezoelectric materials, or combinations of at least two thereof.

In one embodiment, the piezoelectric material for piezoelectric nanowires 210 may have semiconductor characteristics. In one embodiment, for example, piezoelectric nanowires 210 including undoped zinc oxide (ZnO) have n-type semiconductor characteristics.

The piezoelectric organic material layer 310 covering the piezoelectric nanowires 210 may be an insulating piezoelectric organic material such as polyvinylidene fluoride ("PVDF"), or a composite material including an organic material having semiconductor characteristics such as poly (3-hexylthiophene) (P3HT), polyaniline, polypyrrole, poly (p-phenylene vinylene) ("PPV"), polyvinylene, polyacetylene, polythiophene, and derivatives thereof.

The piezoelectric organic material layer 310 may be disposed on and laminated on the piezoelectric structure, in accordance with various methods such as spin coating, dip coating, sputtering, e-beam evaporation, thermal evaporation, and the like.

As shown in FIG. 1B, when the piezoelectric nanowire structure is pressed from an outside of the piezoelectric nanowire structure, the piezoelectric nanowires 210 in the piezoelectric nanowire structure are compressed in an applied direction of the force pressing the piezoelectric nanowire structure. Since the piezoelectric organic material layer 310 extends across areas between the adjacent protruding portions of the piezoelectric nanowires 210, when being pressed from the outside, the plurality of piezoelectric nanowires 210 tend to be collectively deformed under the influence of the unitary indivisible piezoelectric organic material layer 310.

In the illustrated embodiment of FIGS. 1A and 1B, the piezoelectric organic material layer 310 covering the piezoelectric nanowire 210 protects, and reduces or effectively prevents damage to the piezoelectric nanowires 210, such as being broken. In addition, the piezoelectric characteristics of the piezoelectric nanowire structure are improved by the piezoelectric characteristics of the piezoelectric organic material layer 310.

Figure 2A:
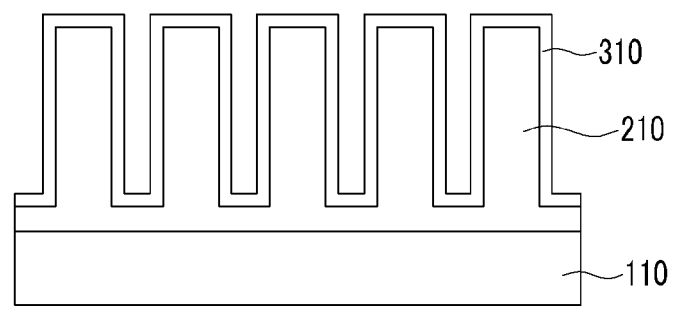
FIG. 2A is a cross-sectional view showing another embodiment of a piezoelectric nanowire structure, according to the invention.

Hereinafter, the piezoelectric nanowire structure according to another embodiment is described with reference to FIG. 2A and FIG. 2B. FIG. 2A is a cross-sectional view showing another embodiment of a piezoelectric nanowire structure, according to the invention, and FIG. 2B a cross-sectional view showing an embodiment of the operation of the piezoelectric nanowire structure in FIG. 2A.

As shown in FIG. 2A, the piezoelectric nanowire structure according to the illustrated embodiment is similar to the piezoelectric nanowire structure shown in FIG. 1A.

The piezoelectric nanowire structure in FIG. 2A includes a base substrate 110, a plurality of a piezoelectric nanowire 210 disposed directly on the base substrate 110, and a piezoelectric organic material layer 310 coated on the surface of the plurality of piezoelectric nanowires 210. In an embodiment, the plurality of a piezoelectric nanowire 210 may be grown directly on the base substrate 110. The piezoelectric nanowires 210 includes a base portion and a plurality of a protruding portion extending directly from the base portion, such that the piezoelectric nanowires 210 collectively form a single unitary indivisible element.

In FIG. 2A, lower surfaces of the piezoelectric organic material layer 310 contacts an entire of an upper and side surfaces of the plurality of a piezoelectric nanowire 210. The piezoelectric organic material layer 310 is only disposed at a predetermined distance from the upper and side surfaces of the plurality of a piezoelectric nanowire 210. In an area between adjacent protruding portions of the piezoelectric nanowires 210, upper surfaces of the piezoelectric organic material layer 310 are spaced apart from each other, where no material of the piezoelectric organic material layer 310 is disposed.

The piezoelectric nanowires 210 may include zinc oxide (ZnO), lead zirconate titanate ("PZT"), barium titanate (BaTiO$_3$), lead titanate (PbTiO$_3$), aluminum nitride ("AlN"), gallium nitride ("GaN"), or silicon carbide ("SiC"), or one of other piezoelectric materials, or a combination of at least two thereof.

In one embodiment, the piezoelectric material for piezoelectric nanowires 210 may have semiconductor characteristics. In one embodiment, for example, the piezoelectric nanowires 210 including undoped zinc oxide (ZnO) may have n-type semiconductor characteristics.

The piezoelectric organic material layer 310 covering the piezoelectric nanowires 210 may include an insulating piezoelectric organic material such as polyvinylidene fluoride ("PVDF"), or a composite material including an organic material having semiconductor characteristics such as poly (3-hexylthiophene) (P3HT), polyaniline, polypyrrole, poly (p-phenylene vinylene) ("PPV"), polyvinylene, polyacetylene, polythiophene, and derivatives thereof.

The piezoelectric organic material layer 310 may be disposed on and laminated on the piezoelectric structure, in accordance with various methods such as spin coating, dip coating, sputtering, e-beam evaporation, thermal evaporation, and the like.

However, differing from the piezoelectric nanowire structure shown in FIG. 1A, the piezoelectric organic material layer 310 of a piezoelectric nanowire structure according to the illustrated embodiment in FIG. 2A is coated only a defined distance from the surfaces of the piezoelectric nanowires 210, and is space apart in areas between adjacent piezoelectric nanowires 210. Thereby, when being pressed from the outside, the plurality of piezoelectric nanowires 210 tend to be individually deformed.

Figure 2B:
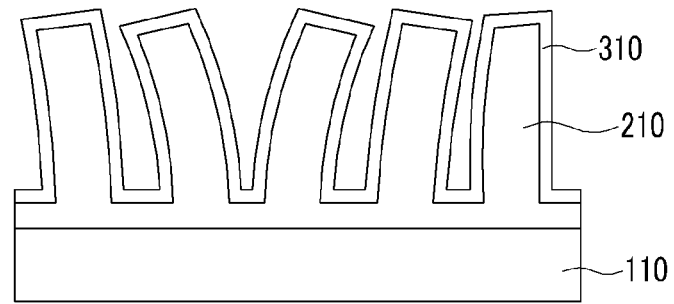
FIG. 2B is a cross-sectional view showing an embodiment of operation of the piezoelectric nanowire structure of FIG. 2A.

As shown in FIG. 2B, when the piezoelectric nanowire structure is pressed from the outside, the piezoelectric nanowires 210 in the piezoelectric nanowire structure are compressed in the upper or lower directions, or compressed or extended while moving in right or left directions. In the illustrated embodiment of FIGS. 2A and 2B, the piezoelectric organic material layer 310 coated on the surface of piezoelectric nanowire 210 protects, and reduced or effectively prevents damage to the piezoelectric nanowires 210. In addition, the piezoelectric characteristics of the piezoelectric nanowire structure is improved by the piezoelectric characteristics of the piezoelectric organic material layer 310.

Figure 3A:
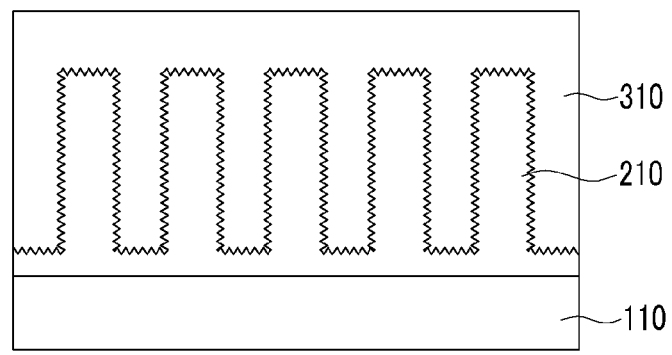
FIG. 3A a cross-sectional view showing another embodiment of a piezoelectric nanowire structure, according to the invention.
Figure 3B:
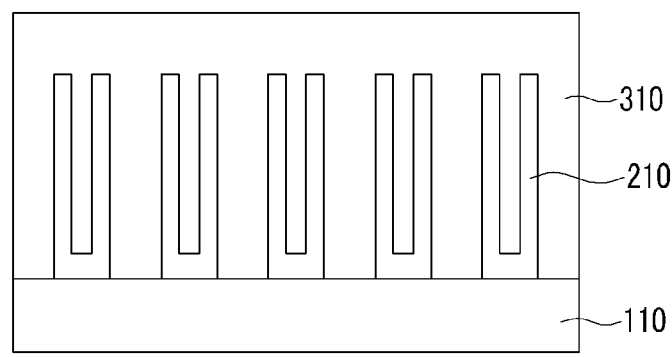
FIG. 3B is a cross-sectional view showing another embodiment of a piezoelectric nanowire structure, according to the invention.

A piezoelectric nanowire structure according to further embodiments is described with reference to FIG. 3A and FIG. 3B. FIG. 3A and FIG. 3B are cross-sectional views showing a piezoelectric nanowire structure according to further embodiments.

As shown in FIG. 3A, the piezoelectric nanowire structure according to a further embodiment is similar to the piezoelectric nanowire structure shown in FIG. 1A.

The piezoelectric nanowire structure according to the illustrated embodiment in FIG. 3A includes a base substrate 110, a plurality of a piezoelectric nanowire 210 disposed directly on the base substrate 110, and a piezoelectric organic material layer 310 covering the plurality of piezoelectric nanowires 210. In an embodiment, the plurality of a piezoelectric nanowire 210 may be grown directly on the base substrate 110. The piezoelectric nanowires 210 includes a base portion and a plurality of a protruding portion extending directly from the base portion, such that the piezoelectric nanowires 210 collectively form a single unitary indivisible element.

The piezoelectric nanowires 210 may include zinc oxide (ZnO), lead zirconate titanate ("PZT"), barium titanate (BaTiO$_3$), lead titanate (PbTiO$_3$), aluminum nitride ("AlN"), gallium nitride ("GaN"), or silicon carbide ("SiC"), or one other piezoelectric material, or at least one or combinations of at least two thereof.

In one embodiment, the piezoelectric material for piezoelectric nanowires 210 may have semiconductor characteristics. In one embodiment, for example, the piezoelectric nanowires 210 including undoped zinc oxide (ZnO) may have n-type semiconductor characteristics.

The piezoelectric organic material layer 310 covering the piezoelectric nanowires 210 may be an insulating piezoelectric organic material such as polyvinylidene fluoride ("PVDF"). The insulating piezoelectric organic material may be also include a composite material including an organic material having semiconductor characteristics such as poly (3-hexylthiophene) (P3HT), polyaniline, polypyrrole, poly (p-phenylene vinylene) ("PPV"), polyvinylene, polyacetylene, polythiophene, and derivatives thereof.

However, differing from the piezoelectric nanowire structure shown in FIG. 1A, the piezoelectric nanowires 210 of the piezoelectric nanowire structure according to the illustrated embodiment are etched to provide an uneven surface. That is, the upper and side surfaces of the piezoelectric nanowires 210 are not entirely planar, and include projections and recesses forming a profile of the upper and the side surfaces. Thereby, contact characteristics with the piezoelectric organic material layer 310 covering the piezoelectric nanowires 210 are improved. The interface contact area of a piezoelectric inorganic material layer of the piezoelectric nanowires 210 and the piezoelectric organic material layer 310 is increased to improve the electrical characteristics, and to induce the piezoelectric inorganic material to be deformed by the external force, so as to improve piezoelectric characteristics.

As shown in FIG. 3B, an inside of the piezoelectric nanowires 210 of the piezoelectric nanowire structure according to the illustrated embodiment is etched in a tube shape. Each of the individual nanowires 210 includes a base portion, and a tubular protruding portion extending directly from the base portion. The piezoelectric organic material layer 310 is disposed in a area within the tubular protruding portion of a nanowire 210, and between adjacent individual nanowires 210. The piezoelectric organic material layer 310 directly contacts an upper surface of the base substrate 110, where the piezoelectric organic material layer 310 does not contact the base substrate 110 in FIGS. 1A-3A. While each of the individual nanowires 210 is a single unitary indivisible member, the nanowires 210 are separated from each other along the base substrate 110.

Thereby, the interface contact area of the piezoelectric inorganic material layer of the piezoelectric nanowires 210 and the piezoelectric organic material layer 310 is increased, so the electronic characteristics are improved and the piezoelectric inorganic material is easily deformed by the external force, so as to improve the piezoelectric characteristics.

Figure 4:
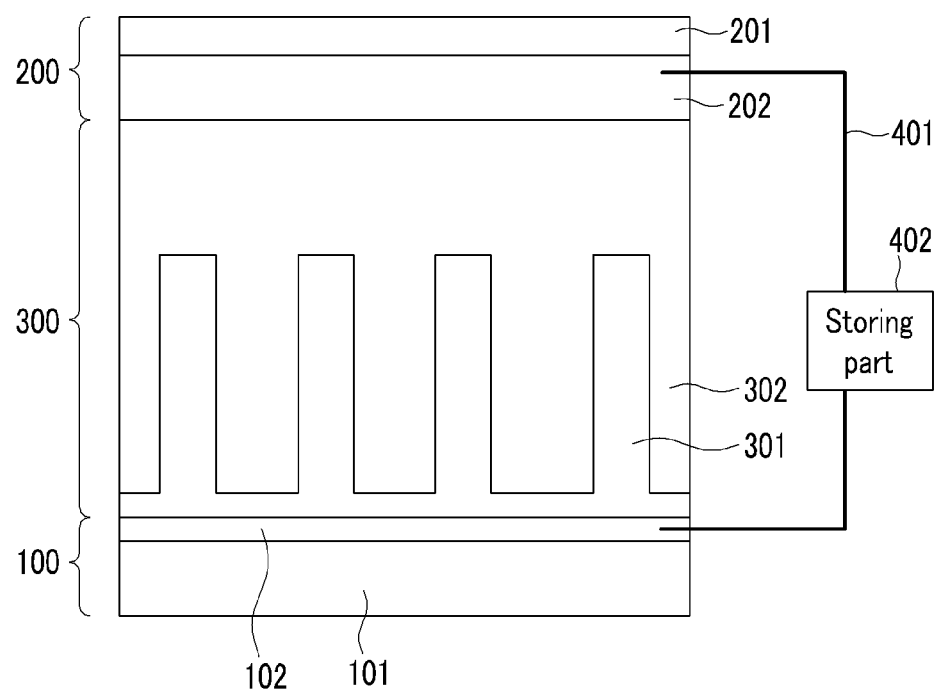
FIG. 4 is a cross-sectional view schematically showing an embodiment of an electrical energy generating device including the piezoelectric nanowire structure, according to the invention.
Figure 5:
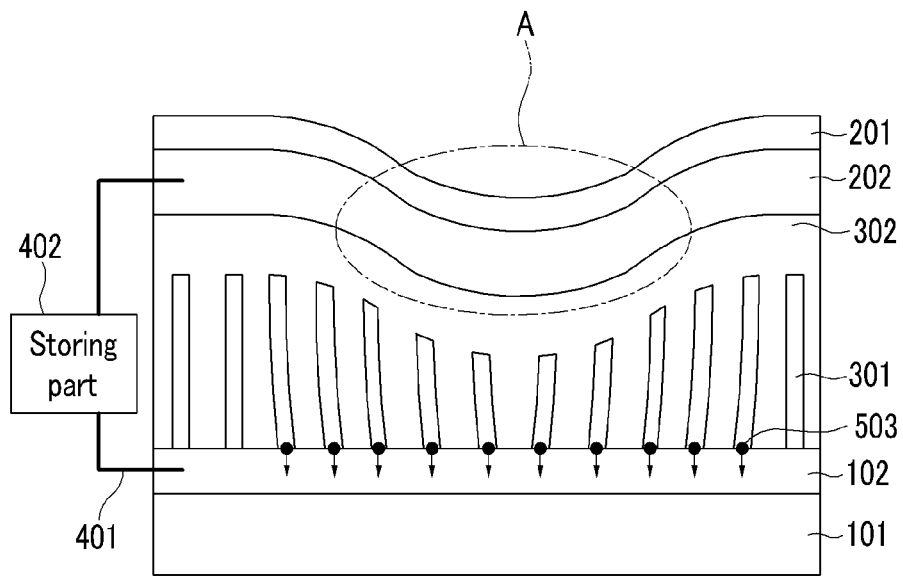
FIG. 5 is a cross-sectional view theoretically showing an embodiment of a first operation of the electrical energy generating device shown in FIG. 4.
Figure 6:
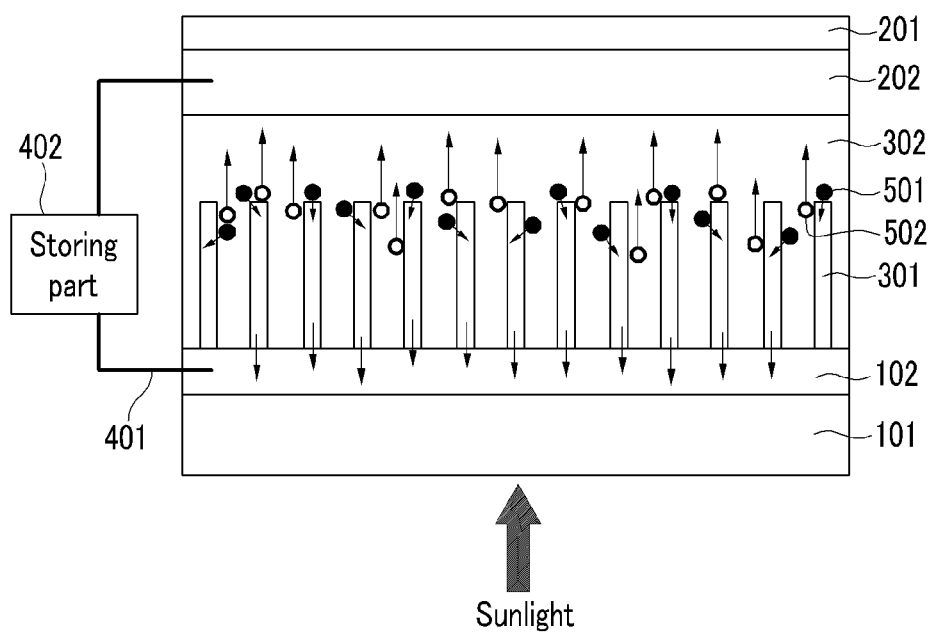
FIG. 6 is a cross-sectional view theoretically showing an embodiment of a second operation of the electrical energy generating device shown in FIG. 4.

An electronic device including the piezoelectric nanowire structure according to an embodiment of the invention, will now be described with reference to FIG. 4 to FIG. 6. FIG. 4 is a cross-sectional view schematically showing an embodiment of an electrical energy generating device including a piezoelectric nanowire structure according to the invention, FIG. 5 is a cross-sectional view theoretically showing an embodiment of a first operation of the electrical energy generating device shown in FIG. 4, and FIG. 6 is a cross-sectional view theoretically showing an embodiment of a second operation of the electrical energy generating device shown in FIG. 4.

As shown in FIG. 4, the illustrated embodiment of the electronic device including a piezoelectric nanowire structure according to the invention is an electrical energy generating device including a lower substrate 100 and an upper substrate 200 facing each other, a piezoelectric nanowire structure 300 disposed between the lower substrate 100 and the upper substrate 200, a connecting part 401 electrically connecting the lower substrate 100 and the upper substrate 200, and a storing part 402 electrically and/or physically connected to the connecting part 401. The piezoelectric nanowire structure 300 may be disposed on the lower substrate 100.

The lower substrate 100 includes a first substrate 101 and a first electrode 102 disposed on the first substrate 101, and the upper substrate 200 includes a second substrate 201 and a second electrode 202 disposed on the second substrate 201. The first substrate 101 and the second substrate 201 may be flexible and transparent. Although it is not shown, a blocking layer and/or a transport layer may be disposed on the first electrode 102 and/or the second electrode 202 in order to accelerate electrons and holes to transport in one direction. In one embodiment, for example, a molybdenum oxide ("MoOx") layer may be coated on the second electrode 202 to inhibit transporting electrons, and to improve transporting holes, so that only holes are selectively transported to the second electrode 202.

Since the first substrate 101 and the second substrate 201 may include a flexible material such as plastic, the shape of the first substrate 101 and the second substrate 201 may be changed depending upon applying external pressure to the piezoelectric nanowire structure 300.

The first electrode 102 may include indium tin oxide ("ITO"), carbon nanotubes ("CNT"), graphene, a transparent conductive polymer, or one of other appropriate materials or combinations of at least two thereof. The second electrode 202 may include gold (Au), a gold-palladium alloy ("AuPd"), palladium (Pd), platinum (Pt), ruthenium (Ru), or one of other appropriate metals or combinations of at least two thereof. At least one of the first electrode 102 and the second electrode 202 may include a flexible electrode that is capable of being deformed by the applied pressure.

The first electrode 102 and the second electrode 202 are physically and/or electrically connected by the connecting part 401. The connecting part 401 may include a conductive material.

The piezoelectric nanowire structure 300 includes a plurality of a piezoelectric nanowire 301 including an inorganic material, and a piezoelectric organic material layer 302 covering the plurality of piezoelectric nanowires.

The piezoelectric nanowire 301 includes an inorganic material having piezoelectric characteristics, and the inorganic material may include zinc oxide (ZnO), lead zirconate titanate (PZT), barium titanate ($BaTiO_3$), lead titanate ($PbTiO_3$), aluminum nitride ("AlN"), gallium nitride ("GaN"), or silicon carbide ("SiC"), or one of other appropriate piezoelectric materials or a combination of at least two thereof. In the illustrated embodiment, the piezoelectric material for piezoelectric nanowires 301 may have semiconductor characteristics. In one embodiment, for example, piezoelectric nanowires 301 including undoped zinc oxide (ZnO) may have n-type semiconductor characteristics.

The piezoelectric organic material layer 302 may have photoelectric conversion characteristics. The piezoelectric organic material layer 302 may include a p-type organic semiconductor generating electron-hole excitons by adsorbing light such as sunlight. Particularly, the piezoelectric organic material layer 302 may include poly(3-hexylthiophene) (P3HT).

A plurality of piezoelectric nanowires 301 may be disposed directly on and contacting the first electrode 102. In one embodiment, the plurality of piezoelectric nanowires 301 may be grown directly on the first electrode 102. When the plurality of piezoelectric nanowires 301 are disposed on the first electrode 102, instead of being directly providing on the first substrate 101, it is easy to control the growth of the piezoelectric nanowires 301. In one embodiment, for example, the piezoelectric nanowires 301 may be grown in a direction perpendicular to a plane of the first electrode 102, and the shape or direction of each piezoelectric nanowire 301 becomes more uniform.

Alternatively, a conductive zinc oxide (ZnO) thin film may be grown on the first substrate 101 before growing the piezoelectric nanowires 301, and the zinc oxide thin film may act as the first electrode 102. The grown zinc oxide thin film would be disposed directly between the first substrate 101 and the piezoelectric nanowires 301.

The protruding portions of the piezoelectric nanowires 301 may longitudinally extend in a direction perpendicular to the surface of the first electrode 102 and the second electrode 202. In an alternative embodiment, the piezoelectric nanowire 301 may longitudinally extend in a slanted direction with respect to the surface the first electrode 102 and the second electrode 202, instead of a perpendicular direction. The number of piezoelectric nanowires 301 shown in the figures is illustrated only as an embodiment, but it is clear that the number and allocation of piezoelectric nanowires 301 may be different depending upon the size and the usage of the device.

Hereinafter, the operation of the electrical energy generating device shown in FIG. 4 is described with reference to FIG. 5 and FIG. 6. FIG. 5 is a cross-sectional view theoretically showing an embodiment of a first operation of the electrical energy generating device shown in FIG. 4, and FIG. 6 is a cross-sectional view theoretically showing an embodiment of a second operation of the electrical energy generating device shown in FIG. 4.

First, the first operation when the electrical energy generating device including the piezoelectric nanowire structure is applied with pressure is described with reference to FIG. 5.

When the electrical energy generating device is applied with pressure, the second substrate 201 and the second electrode 202 may be bent downward at a position (A) where the pressure is applied. According to bending the second substrate 201 and the second electrode 202 downward, the distance between the first electrode 102 and the second electrode 202 is decreased, so the piezoelectric nanowires 301 and the piezoelectric organic material layer 302 disposed at the position (A) may be compressed and deformed.

Thereby, the deformed piezoelectric nanowires 301 and piezoelectric organic material layer 302 exhibit piezoelectric effects. That is, each part of the piezoelectric nanowires 301 and piezoelectric organic material layer 302 has a predetermined potential depending upon the applied compression pressure or tensile stress. The piezoelectric organic material layer 302 covering the piezoelectric nanowires 301 may protect, and reduce or effectively prevent damage, such as breaking, of the piezoelectric nanowires 301. In addition, the piezoelectric characteristic of the piezoelectric nanowire structure is improved by the piezoelectric characteristics of the piezoelectric organic layer 302.

Electrons 503 generated by the piezoelectric effects of the piezoelectric nanowires 301 and the piezoelectric organic material layer 302 are transported to the first electrode 102 or the second electrode 202, so the electrical energy is generated.

The electrical energy generated by the piezoelectric nanowires 301 and the piezoelectric organic material layer 302 may be stored in the storing part 402. In addition, the electrical energy generating device may include a converter (not shown) for converting alternating current ("AC") to direct current ("DC") when the electrical energy is generated as AC.

The storing part 402 may include a rechargeable battery, a capacitor, or other appropriate electrical energy storing element, for example, a nickel-cadmium battery, a nickel-hydrogen battery, a lithium ion battery, or a lithium polymer battery. In addition, the storing part 402 may further include an amplifier (not shown) for amplifying a voltage.

FIG. 5 exemplarily shows the case in which the second substrate 201 and the second electrode 202 are bent by applying pressure to the electrical energy generating device, but the same effect is gained in the case that the pressure is applied to the first electrode 102 or in the case in which the pressure is applied to both the first electrode 102 and the second electrode 202. In other words, the electrical energy is generated by pressing or bending the electrical energy generating device.

An embodiment of a second operation in which the electrical energy generating device including a piezoelectric nanowire structure absorbs light such as sunlight will now be described with reference to FIG. 6.

When the electrical energy generating device is irradiated with light such as sunlight, a part or all of the irradiated light arrives at the piezoelectric nanowire structure 300. If electrons included in the piezoelectric nanowire structure 300 absorb energy from the irradiated light, exited electron-hole pairs (excitons) may be provided through photoelectric conversion characteristics of the piezoelectric organic material layer 302 covering the piezoelectric nanowires 301. The electron-hole pairs (excitons) may be separated into electrons 501 and holes 502 in the interface between the p-type piezoelectric organic material layer 302 and the n-type piezoelectric nanowires 301. The separated electrons 501 are transported to an anode which is the first electrode 102 along with the n-type piezoelectric nanowires 301, and holes 502 are transported to a cathode which is the second electrode 202 along with the piezoelectric organic material layer 302.

In the illustrated embodiment in FIG. 6, the sunlight is irradiated from the lower side of the electrical energy generating device, but the sunlight may be irradiated from the upper side of the electrical energy generating device. When the sunlight is irradiated from the upper side of the electrical energy generating device, the plurality of piezoelectric nanowires 301 induce the effect of concentrating the irradiated light to improve the electrical energy generating efficiency of the piezoelectric nanowire structure 300.

Electrons 501 are transported to the first electrode 102 and holes 502 are transported to the second electrode 202, such that a current may flow through a closed circuit including the first electrode 102 and the second electrode 202 that are connected by the connecting part 401 and the piezoelectric nanowire structure 300. The connecting part 401 is electrically connected with the storing part 402, so the electrical energy generated by the piezoelectric nanowire structure 300 may be stored in the storing part 402.

Thereby, the piezoelectric organic material layer 302 of the piezoelectric nanowire structure may have photoelectric conversion characteristics. Accordingly, the electrical energy generating device including a piezoelectric nanowire structure 300 may generate electrical energy not only by applying pressure to the piezoelectric nanowires using the piezoelectric phenomenon, but also by using light such as sunlight or the like.

Many of characteristics of the piezoelectric nanowire structure shown in FIG. 1A to FIG. 3B may be applied to the piezoelectric nanowire structure 300 included in the electronic device shown in FIG. 4.

Figure 7:
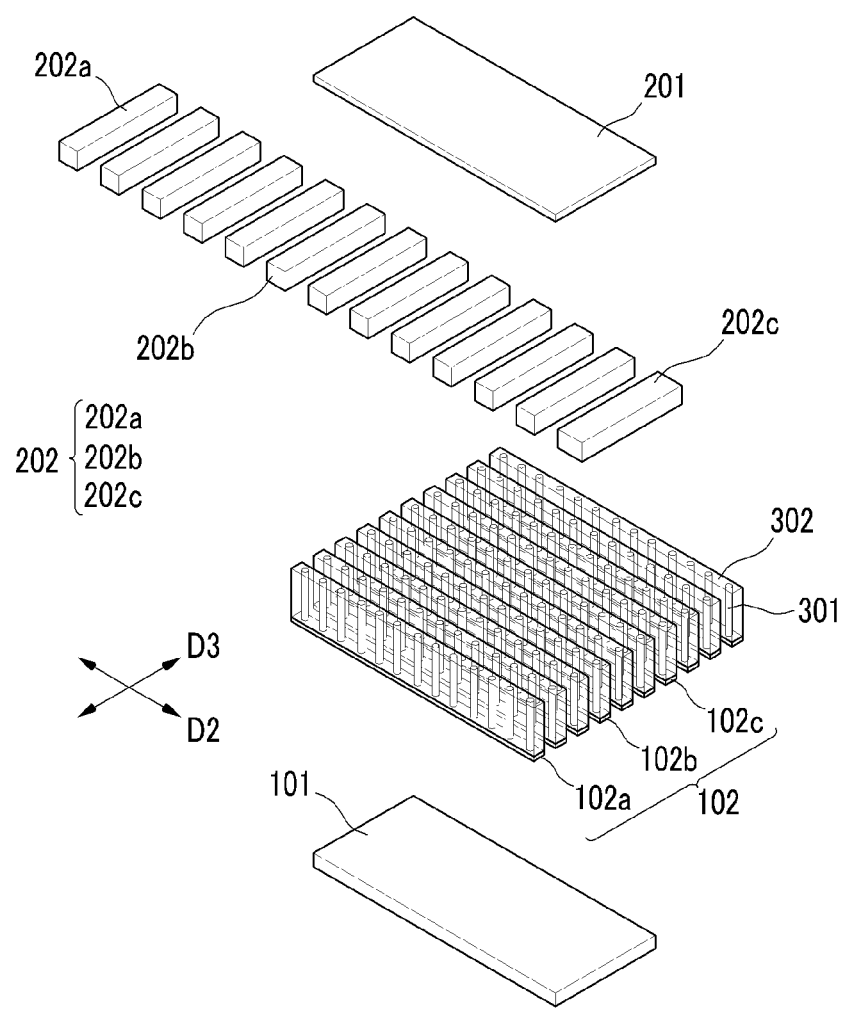
FIG. 7 is an exploded perspective view of an embodiment of an electronic device including a piezoelectric nanowire structure, according to the invention.

Hereinafter, the electronic device including the piezoelectric nanowire structure according to another embodiment is described with reference to FIG. 7. FIG. 7 is an exploded perspective view showing the electronic device including the piezoelectric nanowire structure according to another embodiment.

The electronic device shown in FIG. 7 is similar to the electronic device shown in FIG. 4. Particularly, the composition and functions of the first substrate 101, the second substrate 201, and the piezoelectric nanowire structure 300 of the electronic device shown in FIG. 4 are similar to those of the electronic device shown in FIG. 7, so a detailed description thereof is omitted.

However, differing from the electronic device shown in FIG. 4, the first electrode 102 and the second electrode 202 of the electronic device shown in FIG. 7 are multiply divided. The collective first electrode 102 longitudinally extends in a second direction D3 on the first substrate 101, and includes a plurality of first sub-electrodes 102a, 102b, and 102c arranged spaced apart from each other in the second direction D3. Each of the first sub-electrodes 102a, 102b, and 102c longitudinally extends in a first direction D2.

The collective second electrode 202 longitudinally extends in the first direction D2 perpendicular to the second direction D3 on the second substrate 201, and includes a plurality of second sub-electrodes 202a, 202b, and 202c arranged spaced apart from each other along the first direction D2. Each of the second sub-electrodes 202a, 202b, and 202c longitudinally extends in the second direction D3.

First electrode 102 and second electrode 202 respectively including the plurality of first sub-electrodes 102a, 102b, and 102c and the plurality of second sub-electrodes 202a, 202b, and 202c, may be arrayed in a matrix. That is, the first electrode 102 and second electrode 202 may be arranged overlapping each other, in a plan view of the device, such that at least a portion of the first sub-electrodes and the plurality of second sub-electrodes are arranged overlapping each other. The number of first sub-electrodes 102a, 102b, and 102c and second sub-electrodes 202a, 202b, and 202c shown in FIG. 7 is one embodiment, and is not limited thereto. The numbers may be different depending upon the size and usage of the device.

When employing the electronic device including the first electrode 102 and the second electrode 202 disposed to form a matrix array, it is possible to sense a position of the device where pressure is applied, by sensing where current flows among the plurality of first sub-electrodes 102a, 102b, and 102c and sensing where current flows among the plurality of second sub-electrodes 202a, 202b, and 202c. Accordingly, it is also possible to sense the position of the device where the pressure is applied when the electronic device is applied as a touch sensor or the like. In addition, it is possible to develop a multi-functional device simultaneously accomplishing sensing of pressure and generating energy.

In the electronic device shown in FIG. 7, a plurality of the piezoelectric nanowire 301 is disposed on each of the first sub-electrodes. The piezoelectric nanowires 301 may be disposed on substantially an entire of an upper surface of the first sub-electrodes as shown in FIG. 7. Alternatively, in the electrical energy generating device according to another embodiment, the piezoelectric nanowires 301 may be disposed only in a region where the first electrode 102 crosses the second electrode 202 in the plan view of the device.

In addition, in the electronic device shown in FIG. 7, the first electrode 102 and the second electrode 202 longitudinally extend along directions perpendicular to each other, but this is one embodiment. Alternatively, in the electrical energy generating device according to another embodiment, the second electrode 202 may extend at an angle to the second direction D3 in which the first electrode 102 is extended.

Many of characteristics of the piezoelectric nanowire structure shown in FIG. 1A to FIG. 3B may be applied to the piezoelectric nanowire structure included in the electronic device shown in FIG. 7.

In addition, many characteristics of the electrical energy generating device shown in FIG. 4 to FIG. 6 may be applied to the electronic device shown in FIG. 7.

While this disclosure has been described in connection with what is presently considered to be practical embodiments, it is to be understood that the invention is not limited to the disclosed embodiments, but, on the contrary, is intended to cover various modifications and equivalent arrangements included within the spirit and scope of the appended claims.

What is claimed is:

1. An electronic device comprising:
    a first electrode and a second electrode spaced apart from each other;
    a plurality of piezoelectric nanowires disposed on the first electrode; and
    a piezoelectric organic material layer disposed between the second electrode and the plurality of piezoelectric nanowires, wherein the piezoelectric organic material layer comprises a composite material including an organic material, the organic material including one of polyvinylidene fluoride ("PVDF"), poly(3-hexylthiophene) (P3HT), polyaniline, polypyrrole, poly(p-phenylene vinylene) ("PPV"), polyvinylene, polyacetylene, polythiophene, derivatives thereof, and combinations thereof,
wherein
    the piezoelectric nanowires comprise an n-type semiconductor, and
    the piezoelectric organic material layer comprises a p-type organic semiconductor generating electron-hole excitons by adsorbing light.

2. The electronic device of claim 1, wherein at least one of the first electrode and the second electrode has flexibility and is deformable by an applied pressure.

3. The electronic device of claim 2, further comprising a first substrate contacting the first electrode, and a second substrate contacting the second electrode,
    wherein at least one of the first substrate and the second substrate has flexibility and is deformable by the applied pressure.

4. The electronic device of claim 1, wherein at least one of the first electrode and the second electrode comprises a transparent material.

5. The electronic device of claim 1, wherein the nanowires comprise zinc oxide (ZnO), lead zirconate titanate ("PZT"), barium titanate ($BaTiO_3$), lead titanate ($PbTiO_3$), aluminum nitride ("AlN"), gallium nitride ("GaN"), or silicon carbide ("SiC").

6. The electronic device of claim 1, wherein
    the first electrode comprises a plurality of first sub-electrodes,
    the second electrode comprises a plurality of second sub-electrodes,
    the plurality of first sub-electrodes is spaced apart from each other in a second direction, and each of the first sub-electrodes extends along a first direction, and
    the plurality of second sub-electrodes is spaced apart from each other in the first direction, and each of the second sub-electrodes extends along the second direction which is perpendicular to the first direction.

7. The electronic device of claim 1, further comprising
    a connecting part electrically connecting the first electrode and the second electrode, and
    a storing part electrically connected to the connecting part.

8. The electronic device of claim 1, further comprising
    a connecting part electrically connecting the first electrode and the second electrode, and
    a DC converter electrically connected to the connecting part.

9. The electronic device of claim 1, wherein the first electrode includes the same material as in the piezoelectric nanowires.

10. An electronic device comprising:
a first electrode and a second electrode spaced apart from each other;
a plurality of piezoelectric nanowires disposed on the first electrode; and
a piezoelectric organic material layer disposed between the second electrode and the plurality of piezoelectric nanowires,
wherein
the piezoelectric nanowires comprise an n-type semiconductor and have an etched surface, and
the piezoelectric organic material layer comprises a p-type organic semiconductor generating electron-hole excitons by adsorbing light.

11. An electronic device comprising:
a first electrode and a second electrode spaced apart from each other;
a plurality of piezoelectric nanowires disposed on the first electrode; and
a piezoelectric organic material layer disposed between the second electrode and the plurality of piezoelectric nanowires,
wherein
the piezoelectric nanowires comprise an n-type semiconductor,
the piezoelectric organic material layer comprises a p-type organic semiconductor generating electron-hole excitons by adsorbing light, and
wherein the piezoelectric organic material layer is disposed in an entire area between adjacent protruding portions of piezoelectric nanowires.

* * * * *